United States Patent
Li

(10) Patent No.: US 6,734,447 B2
(45) Date of Patent: May 11, 2004

(54) ELECTRON FILTER FOR CURRENT IMPLANTER

(75) Inventor: Ming Li, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/217,547

(22) Filed: Aug. 13, 2002

(65) Prior Publication Data

US 2004/0031933 A1 Feb. 19, 2004

(51) Int. Cl.$^7$ .............................................. H01J 37/317
(52) U.S. Cl. ................... 250/492.21; 250/398; 250/290
(58) Field of Search .......................... 250/492.21, 398, 250/290; 257/778, 737, 730, 772, 203, 207, 208, 209, 211

(56) References Cited

U.S. PATENT DOCUMENTS

| 5,289,010 A | * | 2/1994 | Shohet | 250/492.21 |
| 5,374,456 A | * | 12/1994 | Matossian et al. | 427/570 |
| 5,942,039 A | * | 8/1999 | Kholodenko et al. | 118/723 E |
| 6,038,018 A | * | 3/2000 | Yamazaki et al. | 356/237.1 |
| 6,101,971 A | * | 8/2000 | Denholm et al. | 118/723 E |
| 6,132,564 A | * | 10/2000 | Licata | 204/192.15 |

\* cited by examiner

*Primary Examiner*—John R. Lee
*Assistant Examiner*—Zia R. Hashmi
(74) *Attorney, Agent, or Firm*—Tung & Associates

(57) ABSTRACT

An electron filter for trapping dissociated electrons in an ion implantation chamber. The electron filter typically includes at least one filter element which is connected to a voltage source for applying a positive voltage to the filter element. During an ion implantation process, dissociated electrons are drawn from the interior of the chamber and trapped in the filter element to prevent or reduce contamination of the substrates.

20 Claims, 2 Drawing Sheets

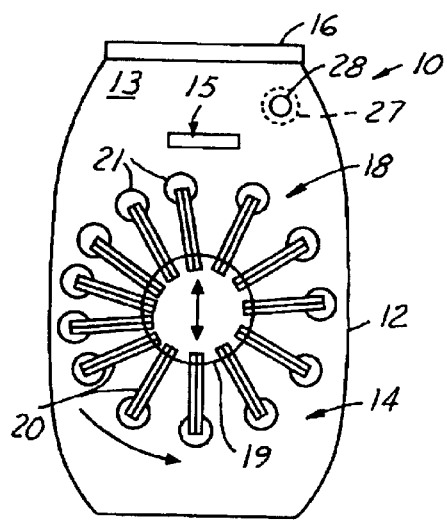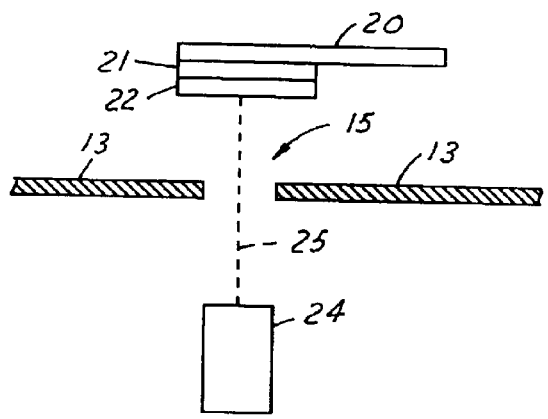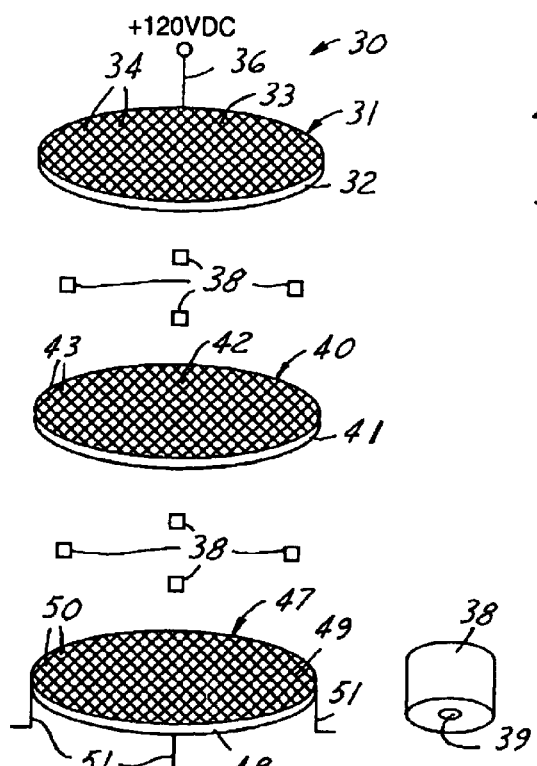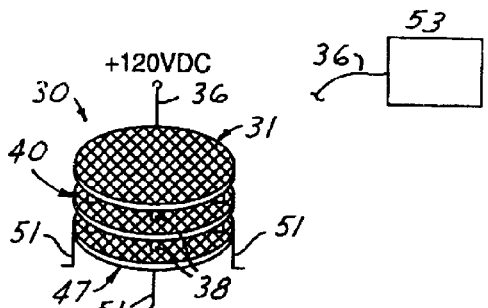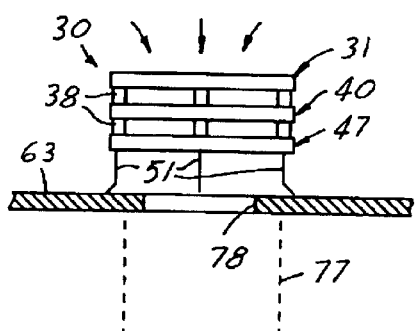
FIG. 1
FIG. 2
FIG. 3
FIG. 3A
FIG. 4
FIG. 5

ELECTRON FILTER FOR CURRENT IMPLANTER

FIELD OF THE INVENTION

The present invention relates to process chambers for processing substrates in the fabrication of semiconductor integrated circuits. More particularly, the present invention relates to an electron filter for removing dissociated electrons from a process chamber, particularly an ion implantation chamber for semiconductors.

BACKGROUND OF THE INVENTION

Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer. Each of these steps, particularly the photoresist stripping step, provides abundant opportunity for organic, metal and other potential circuit-contaminating particles to accumulate on the wafer surface.

In the semiconductor fabrication industry, minimization of particle contamination on semiconductor wafers increases in importance as the integrated circuit devices on the wafers decrease in size. With the reduced size of the devices, a contaminant having a particular size occupies a relatively larger percentage of the available space for circuit elements on the wafer as compared to wafers containing the larger devices of the past. Moreover, the presence of particles in the integrated circuits compromises the functional integrity of the devices in the finished electronic product. Currently, mini-environment based IC manufacturing facilities are equipped to control airborne particles much smaller than 1.0 $\mu$m, as surface contamination continues to be of high priority to semiconductor manufacturers. To achieve an ultra-clean wafer surface, particles must be removed from the wafer, and particle-removing methods are therefore of utmost importance in the fabrication of semiconductors.

Ion implantation is a processing step commonly used in the fabrication of the integrated circuits on the wafer. Ion implantation is a form of doping, in which a substance is embedded into the crystal structure of the semiconductor substrate to modify the electronic properties of the substrate. Ion implantation is a physical process which involves driving high-energy ions into the substrate using a high-voltage ion bombardment. The process usually follows the photolithography step in the fabrication of the circuits on the wafer.

The ion implantation process is carried out in an ion implanter, which generates positively-charged dopant ions in a source material. A mass analyzer separates the ions from the source material to form a beam of the dopant ions, which is accelerated to a high velocity by a voltage field. The kinetic energy attained by the accelerated ions enables the ions to collide with and become embedded in the silicon crystal structure of the, substrate. Finally, the doped silicon substrate is subjected to a thermal anneal step to activate the dopant ions.

A typical conventional ion implantation chamber is generally indicated by reference numeral 10 in FIG. 1 and includes a chamber wall 12 that is provided with a chamber bottom 13 and defines a chamber interior 14. A chamber lid 16 may be provided for closing the chamber interior 14. A scan wheel 18, having a rotatable hub 19 from which extend multiple spoke arms 20, is mounted in the chamber interior 14. A wafer holder 21 is mounted on the extending end of each spoke arm 20. In application, a wafer 22 is mounted on the bottom surface of each wafer holder 21 for the implantation of ions in the wafer 22, as shown in FIG. 2. An ion beam generating system 24, disposed beneath the chamber bottom 13, generates and emits an ion beam 25 upwardly through an elongated slot 15 provided in the chamber bottom 13 adjacent to the scan wheel 18. Accordingly, as the scan wheel 18 rotates typically at a speed of about 900 r.p.m., as indicated in FIG. 1, the wafers 22 mounted on the bottom surfaces of the respective wafer holders 21 are passed over the slot 15, such that the ion beam 25 strikes the surface of the wafer 22 and implants ions from the ion beam 25 into the material layer or layers (not shown) on the wafer 22. A cryo pump 27 is operated to draw process gases and other residual chemicals from the chamber interior 14, through a pump opening 28 in the chamber bottom 13.

The ion implantation process heretofore described is carried out under high-vacuum conditions in the chamber interior 18. These conditions produce dissociated electrons, which adhere to the surface of the wafer 22 during and after the process and are a major source of particle contamination. The resulting particle contamination adversely affects the yield of devices having features with sizes less than 0.13 $\mu$m on the wafer 22.

Accordingly, an object of the present invention is to provide an electron filter for a process chamber used in the processing of substrates.

Another object of the present invention is to provide an electron filter for preventing or minimizing particle contamination of a substrate during or after an ion implantation process.

Still another object of the present invention is to provide an electron filter for trapping electrons during an ion implantation process.

Another object of the present invention is to provide an electron filter which contributes to a clean, reduced-particle environment inside a process chamber.

Yet another object of the present invention is to provide an electron filter which enhances the yield of devices on a substrate.

A still further object of the present invention is to provide an electron filter which is positively charged to facilitate trapping electrons during an ion implantation process.

Yet another object of the present invention is to provide an electron filter which may be used in conjunction with a cryo pump to remove dissociated electrons from the surfaces of substrates and trap the electrons to prevent or reduce particle contamination of the substrates.

Another object of the present invention is to provide a method of removing electrons from substrates or a process chamber in which substrates are processed in order to prevent or at least reduce particle contamination of the substrates.

Still another object of the present invention is to provide an ion implantation chamber which is equipped with an electron filter for the removal of electrons from substrates processed in the chamber or from the chamber interior.

SUMMARY OF THE INVENTION

In accordance with these and other objects and advantages, the present invention comprises an electron filter for trapping dissociated electrons in a substrate processing chamber. The electron filter typically includes at least one filter element which is connected to a voltage source for applying a positive voltage to the filter element. During an ion implantation process, dissociated electrons are drawn from the interior of the chamber and trapped in the filter element to prevent or reduce contamination of the substrates.

In a typical embodiment, the electron filter is mounted directly above a pump opening in the chamber bottom and electrons are trapped in the filter as a cryo pump evacuates particulate contaminants from the chamber. The electron filter may include upper and lower or upper, middle and lower filter elements separated from each other with spacers. In a typical embodiment, the filter element or elements typically have mesh openings less than about 1 mm wide.

BRIEF DESCRIPTION OF THE DRAWINGS

The invention will now be described, by way of example, with reference to the accompanying drawings, in which:

FIG. 1 is a top schematic view illustrating a typical conventional ion implantation chamber;

FIG. 2 is a schematic view illustrating exposure of a substrate to an ion beam in the ion implantation chamber of FIG. 1;

FIG. 3 is an exploded, perspective view of an electron filter of the present invention;

FIG. 3A is a perspective view of a typical spacer element of an electron filter of the present invention;

FIG. 4 is a perspective view of the electron filter, with a voltage source shown schematically connected to the electron filter;

FIG. 5 is a side view of the electron filter, mounted in an ion implantation chamber in implementation of the present invention.

DESCRIPTION OF THE PREFERRED EMBODIMENTS

Figure 6:
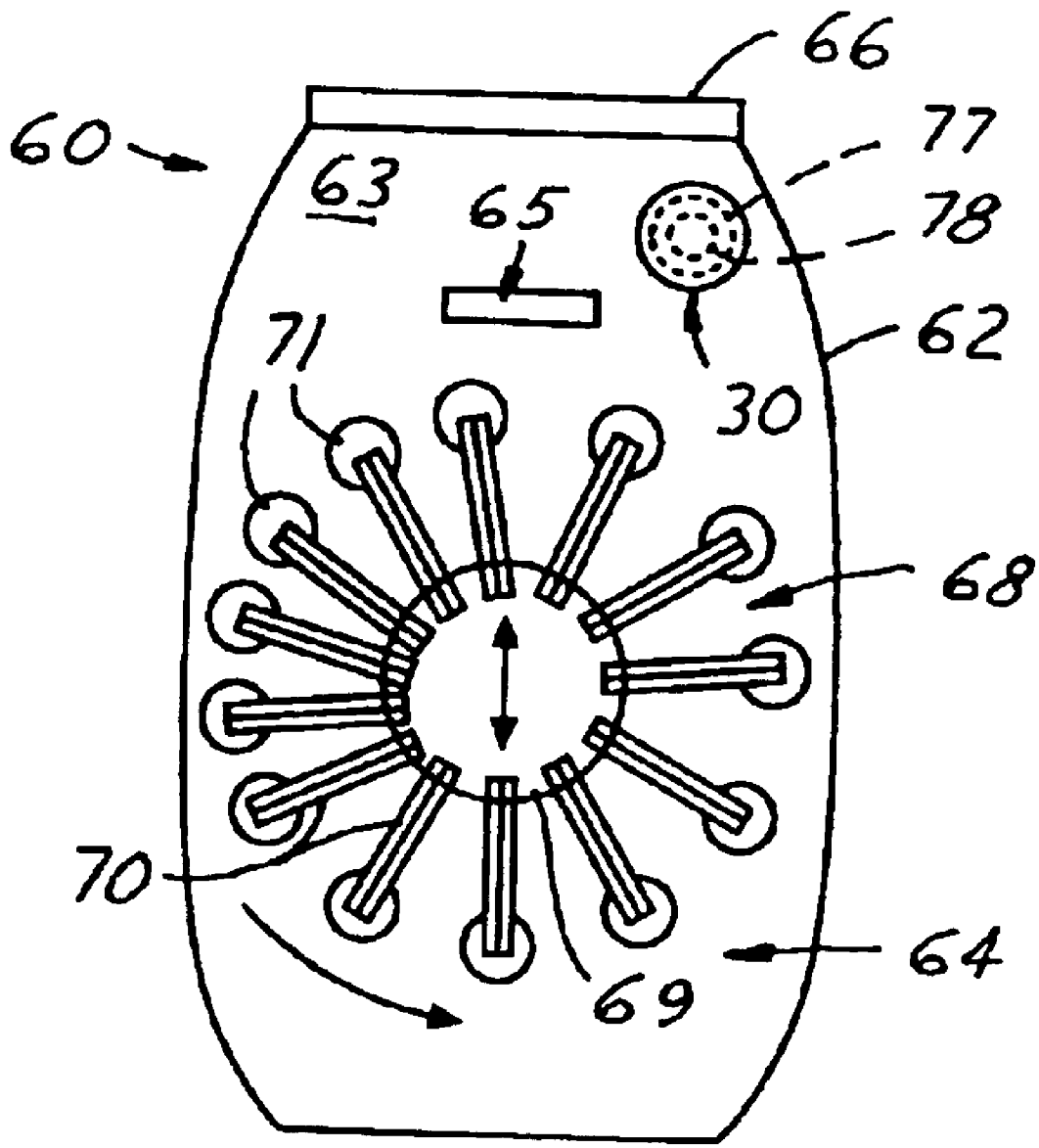
FIG. 6 is a top view of an ion implantation chamber in implementation of the present invention.

When used herein, the term, "filter element" shall be construed to mean any structure comprising an electrically-conductive material and capable of binding dissociated electrons. When used herein, the term, "voltage source" shall be construed to mean any device capable of applying a positive charge or voltage to an electrically-conductive material.

The present invention has particularly beneficial utility in trapping electrons dissociated from an electron source during a process for implanting ions into a substrate. However, the invention is not so limited in application, and while references may be made to such ion implantation processes, the invention may be more generally applicable to trapping electrons in other substrate processing applications or in a variety of industrial and mechanical applications.

Referring initially to FIG. 6, an ion implantation chamber in implementation of the present invention is generally indicated by reference numeral 60 and includes a chamber wall 62 that is provided with a chamber bottom 63 and defines a chamber interior 64. A chamber lid 66 may be provided for closing the chamber interior 64. A scan wheel 68, having a rotatable hub 69 from which extend multiple spoke arms 70, is mounted in the chamber interior 64. A wafer holder 71 is mounted on the extending end of each spoke arm 70. Accordingly, in operation an ion beam generating system (not shown) beneath the chamber bottom 63 emits an ion beam (not shown) through an elongated slot 65 in the chamber bottom 63 and onto each of multiple wafers (not shown) mounted on the bottom surfaces of the respective wafer holders 71, as the scan wheel 68 rotates the wafers over the slot 65, in the same manner heretofore described with respect to FIG. 2.

An illustrative embodiment of the electron filter of the present invention is generally indicated by reference numeral 30 and, as shown in FIG. 3, typically includes an upper filter element 31 having a typically circular upper mesh frame 32 in which is mounted an upper mesh screen 33. The upper mesh screen 33 is constructed of any suitable electrically-conductive material and has mesh openings 34 each of which is typically 1.0 mm or less in width. An electrical lead 36, provided in electrical contact with the upper filter element 31, is further connected to a voltage source 53 which applies a positive voltage of typically about 120 volts DC current to the upper filter element 31, as hereinafter described and according to the knowledge of those skilled in the art.

The electron filter 30 typically further includes a middle filter element 40 which is disposed beneath the upper filter element 31 and is separated therefrom by multiple, typically four, spacers 38. As shown in FIG. 3A, each of the spacers 38 may be cylindrical in shape and is typically constructed of a ceramic material. In a preferred embodiment, each spacer 38 has a height of about 1 cm and may include a screw opening 39 for receiving a screw (not shown) which mounts the spacer 38 between the upper filter element 31 and the middle filter element 40. The spacers 38 may be mounted to the elements of the electron filter 30 according to any suitable alternative method known by those skilled in the art. The middle filter element 40 includes a typically circular upper mesh frame 41 in which is mounted a middle mesh screen 42 that may be constructed of any suitable electrically-conductive material. The middle mesh screen 42 has mesh openings 43 each of which is typically about 1.0 mm or less in width.

The electron filter 30 typically further includes a lower filter element 47 disposed beneath the middle filter element 40. Additional spacers 38, typically four in number, separate the lower filter element 47 from the middle filter element 40. The lower filter element 47 includes a typically circular lower mesh frame 48 in which is mounted a lower mesh screen 49 which may be constructed of any suitable electrically-conductive material. The lower mesh screen 49 has mesh openings 50 each of which is typically 1.0 mm or less in width. Multiple filter mount legs 51 extend downwardly from the lower mesh frame 48 for supporting the electron filter 30 on the chamber bottom 63 of the ion implantation chamber 60, as shown in FIG. 5. Accordingly, as further shown in FIG. 5, the electron filter 30 is typically mounted directly above a pump opening 78, beneath which is mounted a cryo pump 77, with the filter mount legs 51 resting on and typically attached to the chamber bottom 63.

Referring again to FIGS. 5 and 6, in application of the electron filter 30, the ion implantation chamber 60 is operated to implant ions in each of multiple wafers (not shown) mounted on the bottom surfaces of the respective wafer holders 71, in conventional fashion. Accordingly, an ion beam generating system (not shown), disposed beneath the chamber bottom 63, generates and emits an ion beam (not shown) upwardly through the elongated slot 65 provided in the chamber bottom 63 adjacent to the scan wheel 68. As the scan wheel 68 rotates typically at about 900 r.p.m., as indicated in FIG. 6, the wafers mounted on the bottom surfaces of the respective wafer holders 71 are passed over the slot 65, such that the ion beam strikes the surfaces of the respective wafers and implants ions from the ion beam into the material layer or layers (not shown) on the wafers.

During the ion implantation process, the cryo pump 77 is operated to draw process gases and other residual chemicals and particles from the chamber interior 68, through the electron filter 30 and pump opening 78 in the chamber bottom 63, respectively, and into the cryo pump 77. The ion implantation process is carried out under high-vacuum conditions in the chamber interior 64. These conditions produce dissociated electrons, which adhere to the surface of each wafer during and after the process and are a major source of particle contamination. Accordingly, during the ion implantation process, the voltage source 53 is operated to apply a positive electrical voltage, typically 120 volts of DC current, typically to the upper filter element 31 of the electron filter 30. The filter mount legs 51 serve to electrically ground the electron filter 30. This positive charging of the electron filter 30 attracts electrons flowing with the gases and particles through the upper filter element 31, the middle filter element 40 and the lower filter element 47, respectively, to the cryo pump 77. Accordingly, the electrons become bound to the upper mesh screen 33, the middle mesh screen 42 and the lower mesh screen 48, and thus, prevent the electrons from binding and accumulating on the surfaces of the wafers being processed in the chamber 60.

While the preferred embodiments of the invention have been described, it will be recognized and understood that various modifications can be made in the invention and the appended claims are intended to cover all such modifications which may fall within the spirit and scope of the invention.

What is claimed is:

1. An electron filter for a processing chamber, comprising:
   at least one electrically-conductive filter element;
   a voltage source electrically connected to said filter element for applying a positive voltage to said filter element; and
   a pump disposed adjacent to said at least one filter element for drawing electron-carrying gases through said at least one-filter element.

2. The electron filter of claim 1 wherein said at least one electrically-conductive filter element comprises a mesh frame and a mesh screen carried by said mesh frame.

3. The electron filter of claim 1 wherein said at least one electrically-conductive filter element comprises at least two electrically-conductive filter elements.

4. The electron filter of claim 3 wherein said at least two filter elements each comprises a mesh frame and a mesh screen carried by said mesh frame.

5. The electron filter of claim 2 wherein said mesh screen comprises a plurality of mesh openings each having a width of no greater than about 1 mm.

6. The electron filter of claim 5 wherein said at least one electrically-conductive filter element comprises at least two electrically-conductive filter elements.

7. The electron filter of claim 3 wherein said at least two electrically-conductive filter elements comprises three electrically-conductive filter elements.

8. The electron filter of claim 7 wherein each of said filter elements comprises a mesh frame and a mesh screen carried by said mesh frame.

9. The electron filter of claim 3 further comprising a plurality of spacers separating said at least two filter elements from each other.

10. The electron filter of claim 9 wherein said at least two filter elements each comprises a mesh frame and a mesh screen carried by said mesh frame.

11. The electron filter of claim 10 wherein said mesh screen comprises a plurality of mesh openings each having a width of no greater than 1 mm.

12. The electron filter of claim 9 wherein said at least two filter elements comprises three filter elements.

13. A process chamber comprising:
   a chamber comprising a chamber interior for receiving a substrate;
   at least one electrically-conductive filter element provided in said chamber interior, said at least one filter element comprising a mesh screen;
   a voltage source electrically connected to said filter element for applying a positive voltage to said filter element; and
   a pump disposed adjacent to said at least one filter element for drawing electron-carrying gases through said at least one filter element.

14. The process chamber of claim 13 further comprising a mesh frame and wherein said mesh screen is carried by said mesh frame.

15. The process chamber of claim 14 wherein said mesh screen comprises a plurality of mesh openings each having a width of no greater than about 1 mm.

16. The process chamber of claim 13 further comprising a pump opening provided in said process chamber and wherein said pump is provided in communication with said pump opening, and wherein said at least one filter element is provided at said pump opening in the process chamber.

17. The process chamber of claim 13 wherein said at least one filter element comprises at least two filter elements and further comprising a plurality of spacers separating said at least two filter elements from each other.

18. A method for removing dissociated electrons from a process chamber, comprising the steps of:
   providing at least one electrically-conductive filter element comprising a mesh frame and a mesh screen carried by said mesh frame in said process chamber;
   providing a voltage source in electrical contact with said filter element;
   applying a positive voltage to said filter element; and
   drawing electron-carrying gases from the process chamber through said filter element, whereby the dissociated electrons in the process chamber bind to said filter element.

19. The method of claim 18 further comprising the steps of providing a pump opening in said chamber and a pump in communication with said pump opening, and wherein said filter element is provided in the process chamber at said pump opening.

20. The method of claim 18 wherein said at least one filter element comprises at least two filter elements.

* * * * *